United States Patent [19]

Morata

[11] Patent Number: 4,632,571
[45] Date of Patent: Dec. 30, 1986

[54] ELECTRONIC WATCH MODULE ABLE TO ADAPT THE POLARITY OF A CELL TO THAT OF THE WATCH CIRCUIT

[75] Inventor: Philippe Morata, Bienne, Switzerland

[73] Assignee: ETA S.A. Fabriques d'Ebauches, Granges, Switzerland

[21] Appl. No.: 831,765

[22] Filed: Feb. 21, 1986

[30] Foreign Application Priority Data

Feb. 22, 1985 [CH] Switzerland .................... 814/85

[51] Int. Cl.$^4$ ............................................. G04B 1/00
[52] U.S. Cl. .................................... 368/203; 368/204
[58] Field of Search .................................. 368/203, 204

[56] References Cited

U.S. PATENT DOCUMENTS

| 4,251,604 | 2/1981 | Umemoto | 368/204 |
| 4,362,396 | 12/1982 | Perrot | 368/203 |
| 4,478,524 | 10/1984 | Saitoh et al. | 368/203 |

*Primary Examiner*—Bernard Roskoski
*Attorney, Agent, or Firm*—Pollock, Vande Sande & Priddy

[57] ABSTRACT

The module comprises a first printed circuit (1) on one end portion (51) of a flexible support (50), and a second printed circuit (40) housed in a recess (53) provided in the watch plate (22). The first circuit has four conductive areas (2, 3, 8, 9). The second circuit has one side (40b) a first pair of conductive areas (41, 42) and on its other side (40a) a second pair of conductive areas (47,48). Two of the conductive areas (2, 3) of the first circuit are connected to the electrodes of a cell while its two other conductive areas (8, 9) are connected to the supply terminals of an electronic circuit. The second circuit (40) may be placed in the recess (53) in two different positions, identified by a pair of symbols. Each position corresponds to a different cell polarity. Upon folding down said end portion (51) of the flexible support (50) on the watch plate (22) after having placed the second circuit (40) in the position corresponding to the polarity of the cell, the conductive areas of the two printed circuits engage one another to supply the circuit with a voltage of correct polarity.

2 Claims, 5 Drawing Figures

ELECTRONIC WATCH MODULE ABLE TO ADAPT THE POLARITY OF A CELL TO THAT OF THE WATCH CIRCUIT

BACKGROUND OF THE INVENTION

This invention relates to an electronic watch module for electrically connecting a cell to the watch circuit. It is more particularly concerned with a module able to adapt the polarity of the electrodes of the cell to the polarity of the circuit supply terminals.

The cells used in electronic watches are outwardly all similar. They consist of a metal pot-like container of cylindrical shape and of a metal lid which fluidtightly closes off the pot, the lid and the pot being moreover electrically insulated from each other. Depending on the energy capacity of the cell, its size will vary but its general shape remains the same.

Until recently only mercury and silver cells could interchangeably be used in watches with the pot providing the positive electrode, the lid providing the negative electrode.

The cell is housed in a recess provided for that purpose in the watch plate. The recess, which is fitted with a pair of terminals that come into contact with the electrodes, is sized to house a cell having a capacity adapted to the power consumption of the circuit. The terminals, one of which may be clamp-like, are connected to the watch circuit to supply it with voltage of set polarity.

To enable cells of different capacities to be used in one kind of watch or movement, it is known to modify the size of the recess, e.g. by means of removable inserts or spacers.

The cylindrical shape of the cell also enables it to be fitted into the recess in two different ways, either with the lid on top or at the bottom. To enable the circuit to be supplied with the correct polarity regardless of the cell's position in the recess, it is also known to use terminals having a particular shape. The polarity of the cell must of course be well defined.

Lately, lithium cells have been put on the market. They have the advantage over conventional cells of there being very little self-discharge and no likelihood of electrolyte leakage. As regards voltage capacity and size, these new cells are suitable as watch cells but the polarity of their electrodes is the opposite of that of mercury or silver cells, the pot of a lithium cell providing the negative electrode and the lid providing the positive electrode.

Consequently, a conventional mercury or silver cell cannot be replaced by a lithium cell and vice versa in known watches. This is a considerable drawback since it restricts the range of choices among existing cells.

SUMMARY OF THE INVENTION

An object of the invention is to overcome this drawback.

According to the invention there is provided an electronic watch module comprising (a) a first printed circuit having first and second conductive areas arranged to be respectively connected to a pair of electrodes of a cell and third and fourth conductive areas respectively connected to a pair of terminals of an electronic circuit, and (b) a second printed circuit, having conductive areas, arranged to cooperate with the first printed circuit in either of two set and identifiable positions such that, in the first position, the conductive areas of the second printed circuit connect the first area to the third and the second to the fourth and that, in the second position, the conductive areas of the second printed circuit connect the first area to the fourth and the second to the third, thereby enabling said electronic circuit to be supplied, in the first position of the second printed circuit, by a cell whose electrodes have one polarity and, in its second position, by a cell whose electrodes have a reverse polarity.

BRIEF DESCRIPTION OF THE DRAWINGS

In the accompanying drawings, given by way of example and in which the same references have been used to designate similar parts.

DESCRIPTION OF THE PREFERRED EMBODIMENTS

Figure 1A:
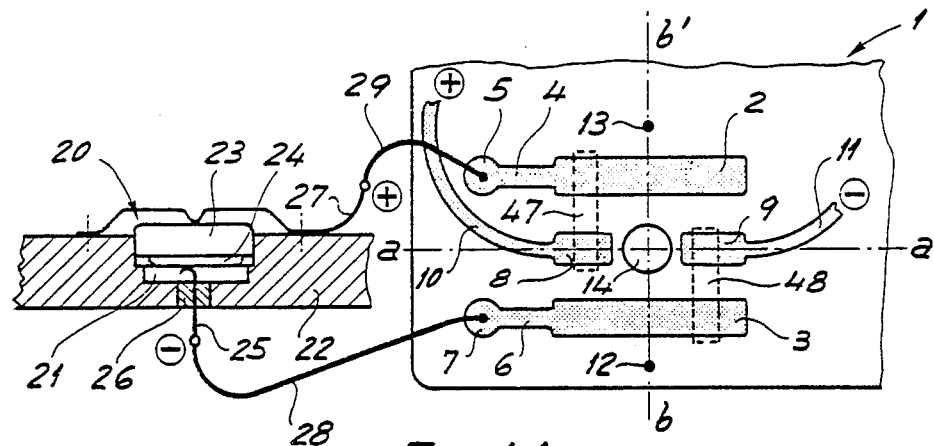
FIG. 1A includes a partial sectional view of a watch plate and a partial plan view of a first printed circuit of a module according to the invention, with the conductive areas of the circuit shown shaded and with a first possible connection arrangement between the conductive areas being shown in broken lines.
Figure 1B:
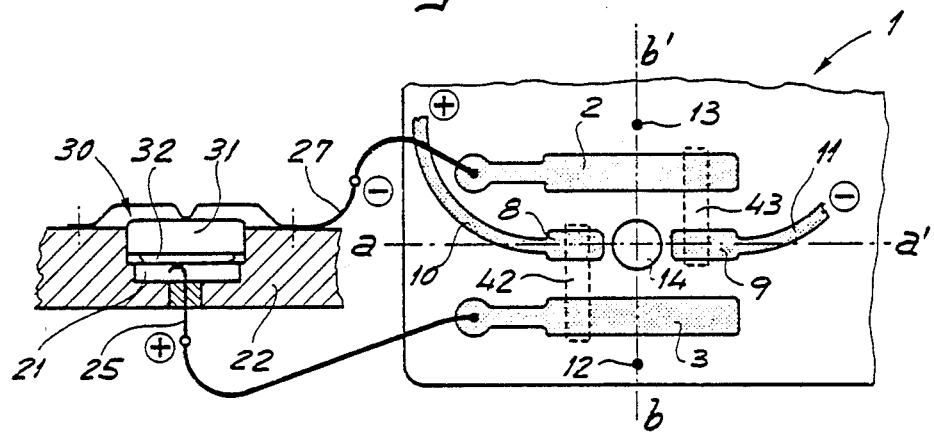
FIG. 1B is identical to FIG. 1A except that it shows, again in broken lines, a second possible connection arrangement between the conductive areas of the printed circuit.
Figure 2A:
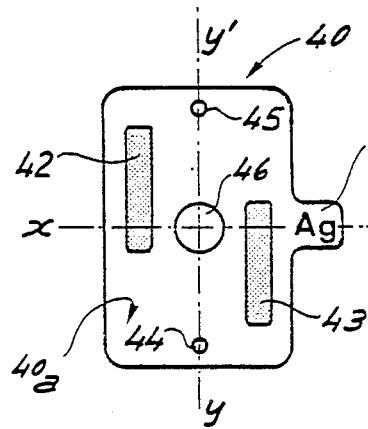
FIG. 2A is a plan view of one side of a second printed circuit with conductive areas arranged on its opposite side to produce the connection arrangement shown in FIG. 1A.
Figure 2B:
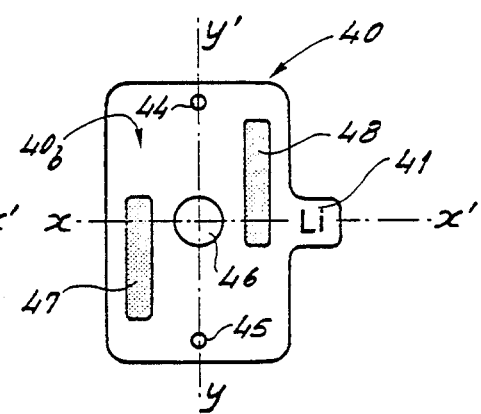
FIG. 2B is a plan view of the opposite side of said second printed circuit with the conductive areas of said one side arranged to produce the connection arrangement shown in FIG. 1B.

The first printed circuit, referenced 1 and shown in FIGS. 1A and 1B, is designed to cooperate with the second printed circuit, referenced 40, shown in FIGS. 2A and 2B.

Circuit 1 comprises a first conductive area 2 of elongated rectangular shape and a second conductive area B similarly shaped as the first. Areas 2 and 3 are disposed symmetrically in relation to an axis aa' extending lengthwise to areas 2 and 3. Area 2 is extended lengthwise by a conductive track 4 ended by a contact 5. Similarly, area 3 is extended by a conductive track 6 ended by a contact 7. Circuit 1 further comprises a third, rectangular, conductive area 8, the longitudinal axis of the rectangle coinciding with axis aa', and a fourth, rectangular, conductive area 9 similarly disposed in relation to axis aa' as the third. The width of all of these conductive areas is much the same whereas the length of areas 8 and 9 is under half that of areas 2 and 3 with their outer ends substantially aligned with the outer ends of areas 2 and 3. Areas 8 and 9 are thus symmetrically disposed in relation to an axis bb' intersecting their middles transversely. Areas 8 and 9 are respectively extended by conductive tracks 10 and 11 ending in a pair of supply terminals of an electronic circuit not shown, which may with advantage be located on the first printed circuit 1. The latter is provided with a pair of positioning pegs 12 and 13 lying on axis bb' equidistantly from axis aa'. At the intersection of axes aa' and bb' is provided a hole 14 for accommodating a fixing screw not shown.

FIG. 1A also shows a silver or mercury cell 20 housed in a recess 21 provided in a watch plate 22. The cell consists of a cylindrical pot 23 fluidtightly closed off by a circular projecting lid 24. The pot 23 provides the positive electrode and lid 24 provides the negative electrode of the cell. Recess 21 has a cylindrical upper portion, having a diameter equal to that of pot 23, and a cylindrical lower portion having a diameter intermediate that of pot 23 and that of lid 24. At the bottom of recess 21 is provided a terminal 25 extending through plate 22. Terminal 25, which is intended to come into contact with the cell, is insulated from plate 22 by an insulating plug 26. The lower, reduced diameter, portion of recess 21 has a height such that when cell 20 is correctly positioned, with pot 23 uppermost, its lid 24 engages terminal 25. But if cell 20 is positioned in recess 21 with pot 23 lowermost, the latter cannot engage terminal 25. Additionally, a clamp-shaped terminal 27, secured by a pair of screws not shown to plate 22, engages pot 23 and firmly holds cell 20 in recess 21. Terminal 25 thus engages the negative terminal of cell 20 and terminal 27 engages the positive terminal of cell 20 if the latter is of the silver or mercury kind. The voltage of cell 20 is finally applied to conductive areas 2 and 3 of printed circuit 2 via a first conductor 28, linking terminal 25 to contact 7, and via a second conductor 29, linking terminal 27 to contact 5.

As previously indicated, FIG. 1B is identical to FIG. 1A except that use is made of a lithium cell 30 having the same shape as cell 20 and substantially the same voltage. Cell 30 also consists of a pot 31 and of a lid 32, but pot 31 here provides the negative electrode while lid 32 provides the positive electrode. Terminals 25 and 27 thus have a polarity opposite that of FIG. 1A.

The second printed circuit 40 has two sides 40a and 40b shown in FIGS. 2A and 2B respectively. It has a roughly rectangular outline with a horizontal axis of symmetry xx' and a vertical axis yy'. Side 40a bears a symbol indicative of the type of cell being used, e.g. Ag for a silver cell, which is borne by a tab 41 extending the circuit along axis xx'. Side 40a has first and second conductive areas 42 and 43, both rectangular and of the same size. The major axes of these areas are parallel to axis yy' and are equidistant from this axis. Area 42 mainly lies in the upper half of circuit 40 although extending somewhat into the lower half. The length of area 42 is slightly greater than the distance between areas 2 and 8 of circuit 1, while its width amounts to about half the length of area 8. Areas 42 and 43 are symmetrically positioned in relation to the point of intersection of axes xx' and yy' and the distance between these two areas, measured along axis xx', is subtantially the same as that between the middles of areas 8 and 9 in circuit 1. A positioning hole 44 is formed along axis yy' of circuit 40 at the same distance as that between peg 12 from axis aa', the diameter of the hole being the same as that of the peg. A second positioning hole, 45, is also formed along axis yy'. It has the same diameter as hole 44 and lies symmetrically to the latter in relation to axis xx'. Further, a hole 46, having the same diameter as hole 14, is provided in circuit 40 at the intersection of axes xx' and yy'.

As shown in FIG. 2B, tab 41 on circuit side 40b bears symbol Li designating a lithium cell. Side 40b has third and fourth conductive areas, 47 and 48, having the same shape and size as areas 42 and 43. Area 47 lies exactly opposite area 42 and area 48 lies exactly opposite area 43.

Circuit 40 cooperates with circuit 1 as follows. Suppose that the cell being used in the watch is a silver cell, as in FIG. 1A. Printed circuit 40 is placed on circuit 1 with the symbol Ag showing as in FIG. 2A, such that peg 12 engages in hole 44 and peg 13 engages in hole 45. In this position, it is side 40b that lies on circuit 1. Area 47 then bridges areas 2 and 8 and area 48 bridges areas 3 and 9, as indicated by the broken lines of FIG. 1A. Good contact between the conductive areas is maintained by a fixing screw, not shown, extending through holes 14 and 46 and which clamps the circuits against one another and holds them in position. Track 10 is thus connected to the positive electrode of cell 20 and track 11 is connected to its negative electrode. It is being assumed that this polarity of tracks 10 and 11 corresponds to the polarity of the supply terminals of the electronic circuit, not shown, to which they are connected.

If silver cell 20 is now replaced by lithium cell 30 of reverse polarity, it suffices to turn printed circuit 40 over about axis xx' for track 10 to remain connected to the positive electrode of the cell and for track 11 to remain connected to the negative electrode. In this position, i.e., that of FIG. 2B with symbol Li showing, it is side 40a that lies on circuit 1. Area 42 then bridges areas 3 and 8 and area 43 bridges areas 2 and 9, as shown by the broken lines of FIG. 1B.

The module just described may be modified in various ways, as will readily be apparent to the man of the art, within the scope of the invention.

Figure 3:
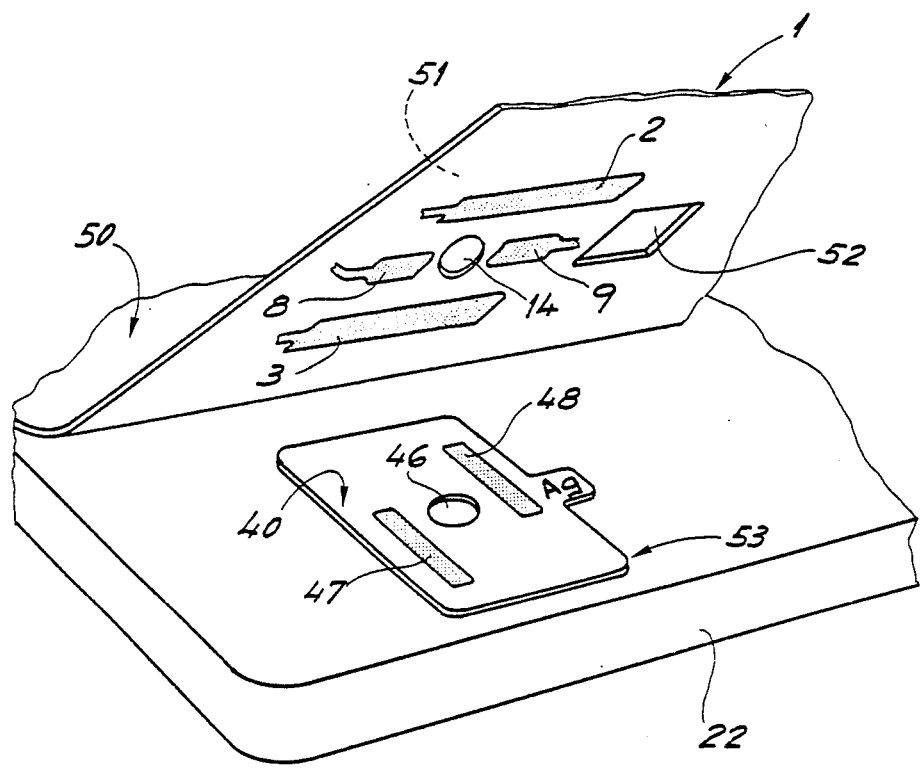
FIG. 3 is a perspective view of a form of embodiment of the module according to the invention in a watch.

For instance, FIG. 3 illustrates another form of embodiment of the module according to the invention. As it takes up little room this embodiment is particularly suited to small volume watch applications. As shown, watch plate 22 bears, here on its topside, a flexible support film 50 which may to advantage include, besides printed circuit 1, for example an integrated circuit and various components not shown. Film 50 is not entirely secured to plate 22 such that its end portion 51 may be lifted and folded back, as shown in FIG. 3. Circuit 1 borne by end portion or flap 51 is a printed circuit identical to printed circuit 1 described earlier. Its underside, facing plate 22, is provided with conductive areas 2, 3, 8 and 9 mentioned earlier. Flap 51 is also formed with a hole 14 and an aperture 52. Within plate 22, a recess 53 is formed beneath the conductive areas of printed circuit 51 to receive printed circuit 40, shown in a position corresponding to the use of a silver or mercury cell with symbol Ag showing. The outline of recess 53 corresponds exactly to that of circuit 40, pegs 12 and 13 and holes 44 and 45 thus becoming otiose. But circuit 40 is still provided with a positioning hole 46 in alignment with a threaded bore in plate 22.

In this latter form of embodiment, it is the side of circuit 40 bearing symbol Ag which engages conductive areas 2, 3,8 and 9. It is therefore this side which is provided with conductive areas 47 and 48, arranged respectively to bridge areas 2 and 8 and areas 3 and 9. The other side of circuit 40 bears symbol Li and conductive areas 42 and 43 (not visible) are arranged to bridge respectively areas 3 and 8 and areas 2 and 9. When circuit 40 is placed in recess 53, in the appropriate position for the type of cell being used, the end portion 51 of flexible film 50 may be folded down against plate 22, with the corresponding cell symbol being displayed through aperture 52. The conductive areas of the two circuits then engage to provide the required electrical connections. The two circuits are then firmly pressed against one another by a screw not shown fixed in plate 22 through holes 14 and 46.

I claim:

1. An electronic watch module comprising (a) a first printed circuit having first and second conductive areas arranged to be respectively connected to a pair of electrodes of a cell and third and fourth conductive areas respectively connected to a pair of terminals of an electronic circuit, and (b) a second printed circuit, having conductive areas, arranged to cooperate with the first printed circuit in either of two set and identifiable positions such that, in the first position, the conductive areas of the second printed circuit connect the first area to the third and the second to the fourth and that, in the second position, the conductive areas of the second printed circuit connect the first area to the fourth and the second to the third, thereby enabling said electronic circuit to be supplied, in the first position of the second printed circuit, by a cell whose electrodes have one polarity and, in its second position, by a cell whose electrodes have a reverse polarity.

2. A module as in claim 1, wherein the first and second conductive areas of said first printed circuit are symmetrically disposed in relation to an axis thereof, with the third and fourth conductive areas lying on said axis between the first and second conductive areas, and wherein said second printed circuit has a first side, bearng a first sign of identification, on which are disposed a first pair of offset conductive areas located on opposite sides of an axis of said second circuit, the distance between said first pair of conductive areas, measured along said latter axis, being substantially equal to the distance between said third and fourth conductive areas measured along the axis of said first circuit, and a second side, bearing a second sign of identification, on which are disposed a second pair of conductive areas located opposite said first pair, one of said positions of the second circuit on the first circuit corresponding to the application of one side of the second circuit against the first circuit such that the axes of the two circuits are co-extensive and that the conductive areas of the second circuit respectively come into contact with the third and fourth conductive areas of the first circuit, the other position being achieved by turning the second circuit over about its axis.

* * * * *